(12) United States Patent
Nguyen et al.

(10) Patent No.: US 10,270,441 B2
(45) Date of Patent: *Apr. 23, 2019

(54) CALIBRATION METHODS AND CIRCUITS TO CALIBRATE DRIVE CURRENT AND TERMINATION IMPEDANCE

(71) Applicant: Rambus Inc., Sunnyvale, CA (US)

(72) Inventors: Huy M. Nguyen, San Jose, CA (US); Vijay Gadde, Cupertino, CA (US); Benedict Lau, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/685,230

(22) Filed: Aug. 24, 2017

(65) Prior Publication Data
US 2018/0019752 A1    Jan. 18, 2018

Related U.S. Application Data

(63) Continuation of application No. 15/191,840, filed on Jun. 24, 2016, now Pat. No. 9,780,784, which is a
(Continued)

(51) Int. Cl.
*H03K 19/00* (2006.01)
*H03K 5/24* (2006.01)
(Continued)

(52) U.S. Cl.
CPC .......... *H03K 19/0005* (2013.01); *H03K 5/24* (2013.01); *H03K 19/01* (2013.01); *H03K 21/08* (2013.01);
(Continued)

(58) Field of Classification Search
None
See application file for complete search history.

(56) References Cited

U.S. PATENT DOCUMENTS 4,513,427 A    4/1985   Borriello
4,707,620 A    11/1987  Sullivan et al.
(Continued)

FOREIGN PATENT DOCUMENTS

EP    0482336 A1    4/1992
JP    02-140676     5/1990
(Continued)

OTHER PUBLICATIONS

Al-Sarawi, Said F., "A Review of 3-D Packaging Technolgy." IEEE Transaction on Components, Packaging, and Manufacturing Technology—Part B, vol. 231, No. 1 Feb. 1998, p. 2-14. 13 pages.
(Continued)

*Primary Examiner* — Minh D A
*Assistant Examiner* — James H Cho
(74) *Attorney, Agent, or Firm* — Silison Edge Law Group LLP; Arthur J. Behiel

(57) ABSTRACT

Described are on-die termination (ODT) systems and methods that facilitate high-speed communication between a driver die and a receiver die interconnected via one or more signal transmission lines. An ODT control system in accordance with one embodiment calibrates and maintains termination resistances and drive currents to produce optimal output swing voltages. Comparison circuitry employed to calibrate the reference resistance is also used to calibrate the drive current. Termination elements in some embodiments are divided into two adjustable resistive portions, both of which are designed to minimize capacitive loading. One portion is optimized to produce a relatively high range of adjustment, while the other is optimized for fine-tuning and glitch-free switching.

20 Claims, 8 Drawing Sheets

Related U.S. Application Data continuation of application No. 14/884,007, filed on Oct. 15, 2015, now Pat. No. 9,391,613, which is a continuation of application No. 13/626,555, filed on Sep. 25, 2012, now Pat. No. 9,191,243, which is a continuation of application No. 13/088,964, filed on Apr. 18, 2011, now Pat. No. 8,278,968, which is a continuation of application No. 12/819,939, filed on Jun. 21, 2010, now Pat. No. 7,928,757, which is a continuation of application No. 12/506,074, filed on Jul. 20, 2009, now Pat. No. 7,741,868, which is a continuation of application No. 11/893,804, filed on Aug. 17, 2007, now Pat. No. 7,564,258, which is a continuation of application No. 11/639,119, filed on Dec. 13, 2006, now Pat. No. 7,525,338, which is a continuation of application No. 11/100,949, filed on Apr. 6, 2005, now Pat. No. 7,151,390, which is a continuation of application No. 10/657,605, filed on Sep. 8, 2003, now Pat. No. 6,924,660.

(51) Int. Cl.
  *H03K 19/01* (2006.01)
  *H04L 25/02* (2006.01)
  *H03K 21/08* (2006.01)

(52) U.S. Cl.
  CPC ...... *H04L 25/0278* (2013.01); *H04L 25/0298* (2013.01)

(56) References Cited

U.S. PATENT DOCUMENTS

| | | |
|---|---|---|
| 5,254,883 A | 10/1993 | Horowitz et al. |
| 5,298,800 A | 3/1994 | Dunlop |
| 5,396,028 A | 3/1995 | Tomassetti |
| 5,455,844 A | 10/1995 | Ishikawa |
| 5,467,455 A | 11/1995 | Gay et al. |
| 5,606,275 A | 2/1997 | Farhang et al. |
| 5,663,661 A | 9/1997 | Dillon et al. |
| 5,666,078 A | 9/1997 | Lamphier et al. |
| 5,680,060 A | 10/1997 | Banniza |
| 5,726,582 A | 3/1998 | Hedberg |
| 5,745,011 A | 4/1998 | Scott |
| 5,781,028 A | 7/1998 | Decuir |
| 5,838,177 A | 11/1998 | Keeth |
| 5,864,506 A | 1/1999 | Arcoleo et al. |
| 5,864,587 A | 1/1999 | Hunt |
| 5,926,031 A | 7/1999 | Wallace |
| 5,958,026 A | 9/1999 | Goetting et al. |
| 5,969,658 A | 10/1999 | Naylor |
| 5,995,894 A | 11/1999 | Wendte |
| 6,028,484 A | 2/2000 | Cole |
| 6,052,035 A | 4/2000 | Nolan |
| 6,060,907 A | 5/2000 | Vishwanthaiah et al. |
| 6,064,224 A | 5/2000 | Esch, Jr. |
| 6,069,505 A | 5/2000 | Babanezhad |
| 6,127,862 A | 10/2000 | Kawasumi |
| 6,157,206 A | 12/2000 | Taylor et al. |
| 6,166,563 A | 12/2000 | Volk et al. |
| 6,266,001 B1 | 7/2001 | Fang |
| 6,288,564 B1 | 9/2001 | Hedberg |
| 6,291,881 B1 | 9/2001 | Yang |
| 6,297,759 B1 | 10/2001 | Lewyn |
| 6,297,795 B1 | 10/2001 | Kato et al. |
| 6,308,232 B1 | 10/2001 | Gasbarro |
| 6,330,193 B1 | 12/2001 | Yu et al. |
| 6,330,194 B1 | 12/2001 | Thomann et al. |
| 6,344,765 B2 | 2/2002 | Taguchi |
| 6,356,105 B1 | 3/2002 | Volk |
| 6,356,106 B1 | 3/2002 | Greef et al. |
| 6,356,114 B1 | 3/2002 | Selander |
| 6,411,122 B1 | 6/2002 | Mughal |
| 6,418,500 B1 | 7/2002 | Gai |
| 6,424,170 B1 | 7/2002 | Raman |
| 6,429,679 B1 | 8/2002 | Kim et al. |
| 6,442,644 B1 | 8/2002 | Gustavson et al. |
| 6,445,331 B1 | 9/2002 | Stegers |
| 6,448,813 B2 | 9/2002 | Donnelly et al. |
| 6,462,588 B2 | 10/2002 | Lau et al. |
| 6,462,591 B2 | 10/2002 | Garrett et al. |
| 6,467,013 B1 | 10/2002 | Nizar |
| 6,495,997 B2 | 12/2002 | Hall et al. |
| 6,509,756 B1 | 1/2003 | Yu et al. |
| 6,511,901 B1 | 1/2003 | Lam |
| 6,516,365 B2 | 2/2003 | Horowitz et al. |
| 6,525,558 B2 | 2/2003 | Kim |
| 6,530,062 B1 | 3/2003 | Donnelly et al. |
| 6,531,784 B1 | 3/2003 | Shim |
| 6,541,996 B1 | 4/2003 | Rosefield et al. |
| 6,545,522 B2 | 4/2003 | Mughal |
| 6,549,036 B1 | 4/2003 | Lee |
| 6,552,565 B2 | 4/2003 | Chang |
| 6,570,402 B2 | 5/2003 | Koo et al. |
| 6,573,746 B2 | 6/2003 | Kim |
| 6,573,747 B2 | 6/2003 | Radhakrishnan |
| 6,597,298 B2 | 7/2003 | Kim |
| 6,606,004 B2 | 8/2003 | Staszewski |
| 6,608,507 B2 | 8/2003 | Garrett et al. |
| 6,643,787 B1 | 11/2003 | Zerbe et al. |
| 6,647,456 B1 | 11/2003 | Van Dyke et al. |
| 6,661,250 B2 | 12/2003 | Kim |
| 6,711,073 B2 | 3/2004 | Martin |
| 6,717,455 B2 | 4/2004 | Mughal et al. |
| 6,718,416 B1 | 4/2004 | Self et al. |
| 6,734,702 B1 | 5/2004 | Ikeoku et al. |
| 6,762,620 B2 * | 7/2004 | Jang ................ H03K 19/0005 326/27 |
| 6,768,352 B1 | 7/2004 | Maher |
| 6,771,073 B2 | 8/2004 | Henningson |
| 6,781,405 B2 | 8/2004 | Rajan et al. |
| 6,781,406 B2 | 8/2004 | Emberling et al. |
| 6,792,372 B2 | 9/2004 | Lee |
| 6,798,286 B2 | 9/2004 | Dauphinee |
| 6,806,728 B2 | 10/2004 | Nguyen et al. |
| 6,812,735 B1 | 11/2004 | Pham |
| 6,833,729 B2 | 12/2004 | Kim et al. |
| 6,853,938 B2 | 2/2005 | Jeddeloh |
| 6,856,169 B2 | 2/2005 | Frans et al. |
| 6,894,691 B2 | 5/2005 | Juenger |
| 6,924,660 B2 | 8/2005 | Nguyen et al. |
| 6,940,303 B2 | 9/2005 | Vargas |
| 6,965,529 B2 | 11/2005 | Zumkehr et al. |
| 6,981,089 B2 | 12/2005 | Dodd et al. |
| 7,102,200 B2 | 9/2006 | Fan et al. |
| 7,148,721 B2 | 12/2006 | Park |
| 7,151,390 B2 | 12/2006 | Nguyen et al. |
| 7,230,448 B2 | 6/2007 | Choe |
| 7,389,194 B2 | 6/2008 | Nguyen et al. |
| 7,525,338 B2 | 4/2009 | Nguyen et al. |
| 7,564,258 B2 | 7/2009 | Nguyen et al. |
| 7,741,868 B2 | 6/2010 | Nguyen et al. |
| 7,928,757 B2 | 4/2011 | Nguyen et al. |
| 8,278,968 B2 | 10/2012 | Nguyen et al. |
| 9,191,243 B2 | 11/2015 | Nguyen et al. |
| 2001/0047450 A1 | 11/2001 | Gillingham et al. |
| 2002/0050838 A1 * | 5/2002 | Kim ................ H03K 19/0005 326/30 |
| 2002/0063576 A1 | 5/2002 | Kim et al. |
| 2002/0141896 A1 | 10/2002 | Komazaki et al. |
| 2002/0175716 A1 | 11/2002 | Cyrusian |
| 2003/0080774 A1 | 5/2003 | Funaba |
| 2003/0087671 A1 | 5/2003 | Ruha et al. |
| 2003/0117147 A1 * | 6/2003 | Song ................ H04L 25/0298 324/601 |
| 2004/0000926 A1 | 1/2004 | Ooshita |
| 2004/0008054 A1 | 1/2004 | Lesea et al. |
| 2004/0021481 A1 | 2/2004 | Ohno |
| 2004/0124850 A1 | 7/2004 | Koneru |
| 2004/0201402 A1 | 10/2004 | Rajan et al. |
| 2005/0041683 A1 | 2/2005 | Kizer |
| 2005/0052200 A1 | 3/2005 | Nguyen et al. |

(56) References Cited

U.S. PATENT DOCUMENTS

| | | |
|---|---|---|
| 2005/0057275 A1 | 3/2005 | Ngyuen et al. |
| 2005/0057278 A1 | 3/2005 | Nguyen et al. |
| 2006/0007761 A1 | 1/2006 | Ware et al. |
| 2006/0077731 A1 | 4/2006 | Ware et al. |

FOREIGN PATENT DOCUMENTS

| | | |
|---|---|---|
| WO | WO-1997-002658 | 1/1997 |
| WO | WO-1998-004041 | 1/1998 |
| WO | WO-2000-041300 | 7/2000 |
| WO | WO-2000-070474 | 11/2000 |
| WO | WO-2002-37781 | 5/2002 |
| WO | WO-2004-061690 A3 | 7/2004 |

OTHER PUBLICATIONS

Asahina et al., "Output Buffer with On-Chip Compensation Circuit," IEEE 1993 Custom Integrated Circuits Conferene, pp. 29.1.1-29.1.4. 4 pages.

Babcock, J.A., "Precision Electrical Timming of Very Low TCR Poly-SiGe Resistors." IEEE Electron Device Letters, vol. 21, No. 6, Jun. 2000. p. 283-285. 3 pages.

Cypress Semiconductor Corporation, "9-Mb Pipelined SRAM with QDR Architecture," Advanced Information, CY7C1304V25, Feb. 15, 2000. 23 pages.

Diermeier, Andrea. "Interfacing between LVDS and ECL", Microprocessors and Microsystems, IPC Business Pess LTD, London GB, vol. 21 No. 5, Feb. 1998, pp. 337-342. 6 pages.

Esch, Jr., et al., "Theory and Design of CMOS HSTL I/O Pads," The Hewlett Packard Journal, Article 5, pp. 46-52, Aug. 1998. 7 pages.

Exhibit A—Declaration of Joseph McAlexander in Support of Comments by Third Party Requester Pursuant to 37 C.F.R. 7.947, dated May 15, 2008, In re Inter Partes Reexamination Control No. 95/001,008. 4 pages.

Farrell, Todd, "Core Architecture Doubles MEM Data Rate," in Electronic Engineering Times Asia, Dec. 16, 2005. 4 pages.

Fujisawa et al., "An 8.4ns Column-Access 1.3Gb/s/pin DDR3 SDRAM with an 8.4 Multiplexed Data-Transfer Scheme," Feb. 7, 2008, IEEE International Solid-State Circuits Conference, Session 8, DRAM and TCAM, 8.4. 10 pages.

Gabara et al., "Digitally Adjustable Resistors in CMOS for High-Perforance Applications," IEEE Journal of Solid-State Circuits, vol. 27, No. 8, Aug. 1992. 10 pages.

Gabara, Thaddeus J. et al., "A 200 MHz 100K ECL Output Buffer for CMOS ASICs." 1990 IEEE. pp. 4.

Gabara, Thaddeus J., "On-Chip Terminating Resistors for High Speed ECL-CMOS Interfaces," Feb. 1992. IEEE, p. 292-295, 4 pages.

Gabara, Thaddeus J., et al., "Digitally Adjustable Resistors in CMOS for High-Performance Applications," IEEE J. of Solid-State Circiuts, vol. 27, No. 8, Aug. 1992, pp. 1176-1185.

Gillingham, Peter, "SLDRAM Architectural and Functional Overview," SLDRAM Consortium, Aug. 29, 1997, pp. 1-14. 14 pages.

Intel Corporation, "Intel 430TX PCISET: 82439TX System Controller (MTXC)," Preliminary, Order No. 290559-001, Feb. 1997. 84 pages.

Janzen, Jeff, "DDR2 Offers New Features and Functionality," Designline, vol. 12, Issue 2, Micron, Jul. 31, 2003, EN.L. 16 pages.

Johnson, Chris, "Graphics DDR3 On-Die Termination and Thermal Considerations," Micron Designline, vol. 12, Issue 1, Rev. Apr. 1, 2003, 1Q03/2Q03. 8 pages.

Johnson, Chris, "The Future of Memory: Graphics DDR3 SDRAM Functionality," Micron Designline, vol. 11, Issue 4, 4Q02, Oct. 2002. 8 pages.

Khouri, Gaby "Evaluation of Alcatel Patent Portfolio by Semiconductor Insights." Nov. 2004. Copyright Semiconductor Insights Inc. 36 pages.

Kim, Su-Chul, "Programmable Digital On-Chip Terminator." ITC-CSCC, 2002. 4 pages.

Knight et al., "Self-Terminating Low-Voltage Swing CMOS output Driver," IEEE Journal of Solid-State Circuits, vol. 23, No. 2, Apr. 1988. 8 pages.

Ko, Hyoung-Soo, "Development of 3-Dimensional Memory Die Stack Packages Using Polymer Insulated Sidewall Technique." 1999 Electronic Components and Technology Conference. pp. 663-667.

Micron Technical Note, "DDR2-533 Memory Design Guide for Two-DIMM Unbuffered Systems," TN-47-01, 2003. 19 pages.

Micron Technology, Inc., "9Mb DDR SRAM, MT57V256H36P," 256K×36 2.5V Vdd, HSTL, Pipelined DDR SRAM, Advance, 2000, Rev. Mar. 2000. 23 pages.

Micron Technology, Inc., "Graphics DDR3 DRAM," Advance, 256 Mb×32 GDDR3 DRAM, © 2003, pp. 1-67. 67 pages.

Nakase et al., "Source-Synchronization and Timing Vernier Techniques for 1.2 GB/s SLDRAM Interface," IEEE Journal of Solid-State Circuits, vol. 34, No. 4, Apr. 1999, pp. 494-501. 8 pages.

Nguyen et al., U.S. Appl. No. 11/639,119, filed Apr. 6, 2005, re Application and Paperwork as Filed. 36 pages.

Nguyen, Huy, U.S. Appl. No. 12/506,074, filed Jul. 20, 2009, re Notice of Allowance and Fee(s) Due dated Feb. 22, 2010. 14 pages.

Nguyen, Huy, U.S. Appl. No. 12/819,939, filed Jun. 21, 2010, re Notice of Allowance and Fee(s) Due dated Dec. 28, 2010. 13 pages.

Nguyen, Huy, U.S. Appl. No. 12/819,939, filed Jun. 21, 2010, re Preliminary Amendment dated Jun. 24, 2010. 9 pages.

Nguyen, Huy, U.S. Appl. No. 13/088,964, filed Apr. 18, 2011, re Final Office Action dated Mar. 14, 2012. 8 pages.

Nguyen, Huy, U.S. Appl. No. 13/088,964, filed Apr. 18, 2011, re Office Action dated Sep. 1, 2011. 15 pages.

Nguyen, Huy, U.S. Appl. No. 13/088,964, filed Apr. 18, 2011, re Response dated May 2, 2012 to the Final Office Action dated Mar. 14, 2012. 9 pages.

Nguyen, Huy, U.S. Appl. No. 13/088,964, filed Apr. 18, 2011, re Response submitted Sep. 23, 2011 to the Office Action dated Sep. 1, 2011. 11 pages.

Paris et al., "WP 24.3: A 800 MB/s 72 Mb SLDRAM with Digitally-Calbrated SLL," ISSCC, 0-7803-5129-0/99, Slide Supplement, IEEE, 1999, 10 pages.

PCT International Search Report and Written Opinion dated Jun. 28, 2005, re International Application No. PCT/US2004/014150. 21 pages.

Rambus Inc., "Hastings Rambus Asic Cell Specification Generic Implementation," Revision 0.1 Preliminary, copyright Aug. 2000, modified Jun. 20, 2000. 70 pages.

Rhoden et al., "DDR/DDR2/DDR3 SDRAM Tutorial," Oct. 25-26, 2005, Slide Presentation. 118 pages.

Shah et al., "A Temperature Indpendent Trimmable Current Source," Department of Engineering Science, University of Oxford, ISCAS 2002. 4 pages.

SLDRAM Inc., "SLD4M18DR400 4 MEG×18 SLDRAM: 400 Mb/s/pin SLDRAM 4 M×18 SLDRAM Pipelined, Eight Bank, 2.5 V Operation," Jul. 9, 1998, 69 pages.

Ware Frederick A., "Direct RAC Data Sheet," Advance Information, Document DL0064, Version 1.11, Copyright Jul. 2000, Rambus Inc. 66 pages.

Xilinx Inc., "Xilinx Digitally Controlled Impedance (DCI) Technology," VTT011(v1.1) Sep. 20, 2001, Virtex Tech Topic. 3 pages.

Xilinx, "Virtex-II Pro Platfom FPGA Handbook," UG012 (v.1.0), Jan. 31, 2002, pp. 44-46. 4 pages.

* cited by examiner

CALIBRATION METHODS AND CIRCUITS TO CALIBRATE DRIVE CURRENT AND TERMINATION IMPEDANCE

BACKGROUND

High-speed data communication integrated circuit (IC) dies are known to include both drivers and receivers. The driver of one such IC connects to the receiver of another via one or more signal transmission lines. Both the driver and receiver circuits include termination elements that attempt to match the characteristic impedance of the transmission line to the output impedance of the driver and input impedance of the receiver, as impedance mismatches degrade signal quality and consequently reduce communication speed and reliability.

Some conventional communication systems employ control systems that calibrate the impedance of on-chip termination elements for improved impedance matching. For a detailed discussion of one such system, see U.S. Pat. No. 6,418,500 entitled "Feedback Control for Termination Adjustment," which issued on Jul. 9, 2002, to Gai et al.

Some high-performance communication systems employ current-mode switching for improved speed performance. Such systems include current-mode drivers, which convey digital signals by modulating current between values representative of different logic levels. The levels of current used to express logic levels are carefully calibrated and controlled to obtain rapid switching and low power consumption. The following issued patents describe conventional circuits for calibrating the drive current for current-mode drivers: U.S. Pat. No. 5,254,883 entitled "Electrical Current Source Circuitry for a Bus," which issued on Oct. 19, 1993, to Horowitz et al., and U.S. Pat. No. 6,462,591 entitled "Semiconductor Memory Device Having a Controlled Output Driver Characteristic," which issued on Oct. 8, 2002, to Garrett et al.

The aforementioned calibration techniques for setting and maintaining appropriate termination resistances and drive currents work well in many applications. High-speed circuits are in a very competitive market, however, and must achieve ever greater performance levels to satisfy customer demand. There is therefore a need for area- and power-efficient communication circuits that exhibit improved speed performance.

SUMMARY

The present invention is directed to efficient on-die termination (ODT) systems and methods that facilitate high-speed communication between a driver die and a receiver die interconnected via one or more signal transmission lines. An ODT control system in accordance with one embodiment calibrates and maintains the termination resistances and drive currents of the driver die to produce optimal output swing voltages on the signal transmission lines. A similar ODT control system calibrates and maintains the termination resistances of the receiver die. The ODT control systems rely upon external voltage and resistance references for termination resistance and drive-current calibration.

An ODT control system in accordance with one embodiment calibrates drive current by matching the drive current to a reference current drawn through a precision resistor, and calibrates termination resistance by matching on-die termination elements with the same external resistor. Comparison circuitry employed to match the reference and drive currents is also used to match the reference and ODT resistances. This sharing of resources saves power and die area. In addition, offset errors introduced by shared components impact the resistance and current calibrations in opposite ways, and thus tend to cancel one another.

Termination elements in some embodiments are divided into two adjustable resistive portions, both of which are designed to minimize capacitive loading. One portion is optimized to produce a relatively high range of adjustment, while the other is optimized for fine-tuning and glitch-free switching. Active ODT control systems can calibrate the first portion before respective drive and receive circuitry and begin communicating, and can then employ the second portion to account for resistive drift that occurs due to supply-voltage and temperature fluctuations. In one embodiment, the second portion employs a serial, thermometer-coded voltage divider to provide glitch-free switching between ODT resistance levels. In another embodiment, the second portion employs an analog voltage divider. Either embodiment can be used to periodically calibrate ODT resistance without introducing undesirable resistive glitches.

This summary does not limit the invention, which is instead defined by the allowed claims.

DETAILED DESCRIPTION

Figure 1:
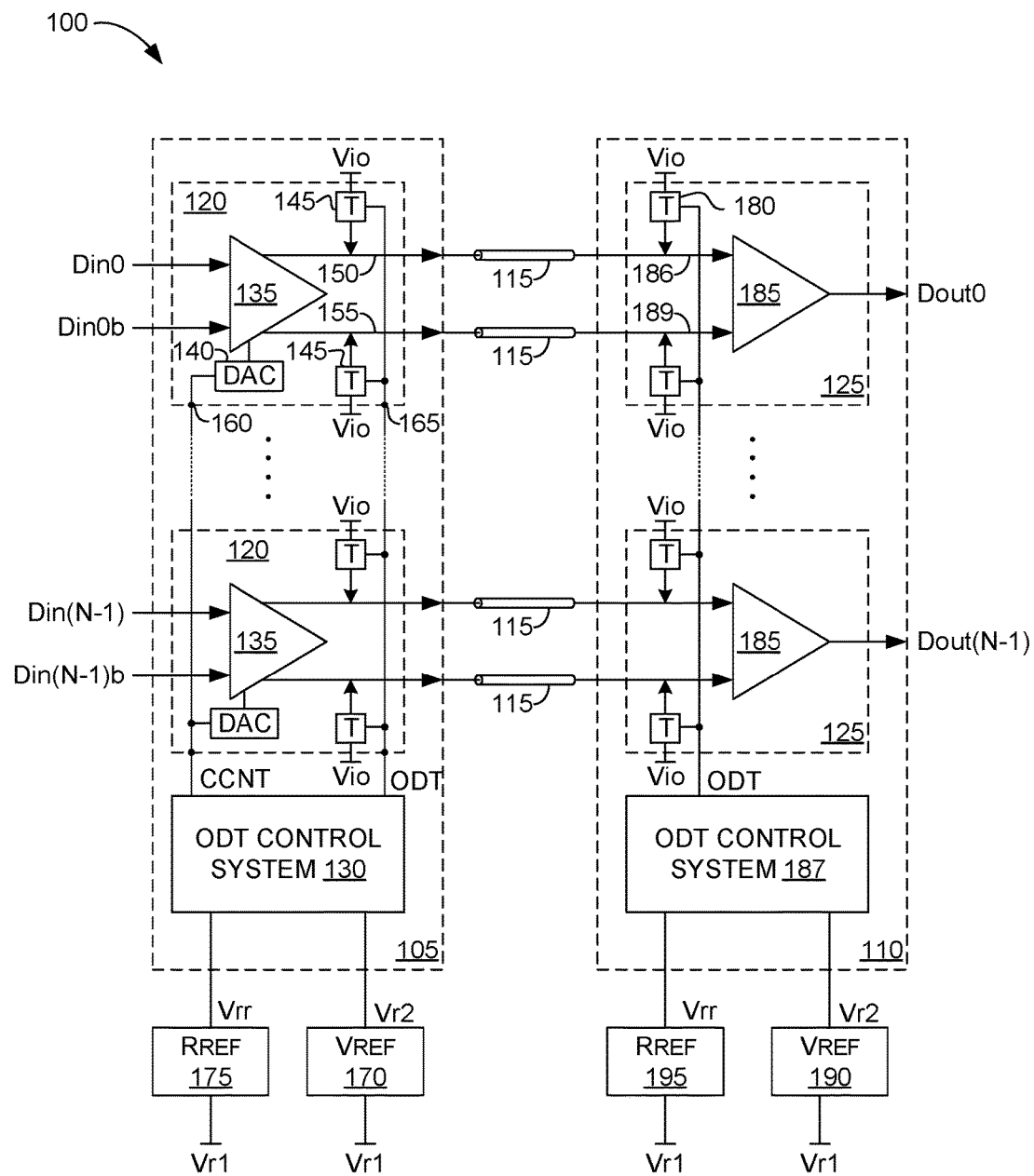
FIG. 1 is a block diagram of a data communication system 100 in accordance with one embodiment.

FIG. 1 is a block diagram of a data communication system 100 in accordance with one embodiment. Communication system 100 includes a first integrated circuit (IC) die 105 connected to a second IC die 110 via a number of signal transmission lines 115. Die 105 includes a plurality of identical driver circuits 120 and an on-die-termination (ODT) control system 130. Control system 130 establishes and maintains the termination resistances and drive currents of driver circuits 120 to produce optimal output swing voltages.

Die 110 includes a plurality of identical receiver circuits 125, each of which receives signals from a corresponding one of driver circuits 120 of die 105. Die 110 includes an ODT control system 187 that establishes and maintains the termination resistance applied to incoming signals to optimize the swing voltages of those signals.

Each of dies 105 and 110 may be any of myriad types of processing chips capable of communicating electrical signals. Typical examples include IC dies that communicate via parallel or serial bus interfaces. Transmission lines 115 may be, for example, a wire, a cable, a trace on a printed-circuit board, a chip etching, a waveguide, or other medium that allows for transmission of signals.

For simplicity, die 105 and die 110 are presumed to support respective driver and receive circuitry; in other embodiments, however, die 105 additionally supports receive circuitry, and die 110 additionally supports transmit circuitry. Such embodiments can use either unidirectional or bidirectional signal lines, as is well known to those of skill in the art. Also important, the depicted embodiment is described in connection with a typical case in which two dies communicate signals via external lines, but other embodiments optimize signal line termination resistance, drive current, and signal swing to improve communication speed between circuits that exist on the same die. Driver circuits 120 are identical, as are receiver circuits 125. The following description is limited to the topmost driver/receiver pair for brevity.

Driver circuit 120 includes a driver 135 receiving an input data stream represented as a pair of complimentary input signals Din0 and Din0b, which are provided on complimentary driver input nodes having the same designations. (As with other designations herein, Din0 and Din0b refer both to signals and their corresponding nodes; whether a given designation refers to a signal or a node will be clear from the context.) Driver 135 additionally includes a pair of driver output terminals 150 and 155 that connect to signal transmission lines 115 via IC pads (not shown). Driver output terminals 150 and 155 convey complimentary output signals derived from the input data stream. (Unless otherwise defined, terminals, lines, conductors, and traces that carry a given signal fall under the umbrella term "node"; in general, the choice of a given description of a circuit node is a matter of style, and is not limiting.)

Driver circuit 120 includes a pair of termination elements 145 and a digital-to-analog converter (DAC) 140. Each of driver output terminals 150 and 155 connects to a reference Vio via a respective adjustable termination element 145, and each termination element 145 receives digital ODT calibration signals from ODT control system 130 via an ODT calibration port 165. Driver circuit 120 additionally includes a current control port 160, which receives digital current-calibration signals from control system 130. DAC 140 converts these digital signals into a current-control voltage that controls the level of drive current provided by driver 135. By controlling both the termination resistance and the drive current of driver circuit 120, ODT control system 130 optimizes the swing voltages on driver output terminals 150 and 155, and consequently reduces noise and improves speed performance.

The resistance values of termination elements 145 and the drive current provided by driver 135 vary with process, voltage, and temperature. ODT control system 130 therefore relies upon precise reference components to establish appropriate termination resistances and drive currents. In the depicted embodiment, die 105 is connected to a first reference Vr1 through an external voltage source 170 and an external precision resistor 175. Reference source 170 conveys a second reference Vr2 to ODT control system 130. The difference between reference Vr1 and Vr2 is used to establish an appropriate swing voltage. Reference resistor 175 conveys a reference-resistor voltage Vrr to ODT control system 130, acting as a reference resistance against which to compare and adjust termination elements 145. A calibration process for establishing the appropriate resistance through termination elements 145 and drive currents provided by drivers 135 is described below in connection with FIGS. 2 and 3.

Receiver circuit 125 within die 110 includes a differential amplifier 185 connected to a pair of complimentary signal transmission lines 115 via respective receiver input terminals 186 and 189. Each of input terminals 186 and 189 connects to reference Vio via a respective termination element 180. Termination elements 180 are similar to elements 145 in this embodiment, and are controlled via a line ODT from an ODT control system 187 similar to system 130. Control system 187 compares the values of termination elements 180 with an off-chip, precision reference resistor 195 to account for process, voltage, and temperature variations that affect the resistance values of termination elements 180. ODT control system 187 is also capable of calibrating drive current, though no drivers are shown in FIG. 1. Where drive-current calibration is desired, control system 187 connects to an external reference 190. Receiver circuit 125 receives the incoming data stream on complimentary input terminals 186 and 189 and presents a resulting data to the interior of IC die 110 via corresponding data output node Dout0.

Figure 2:
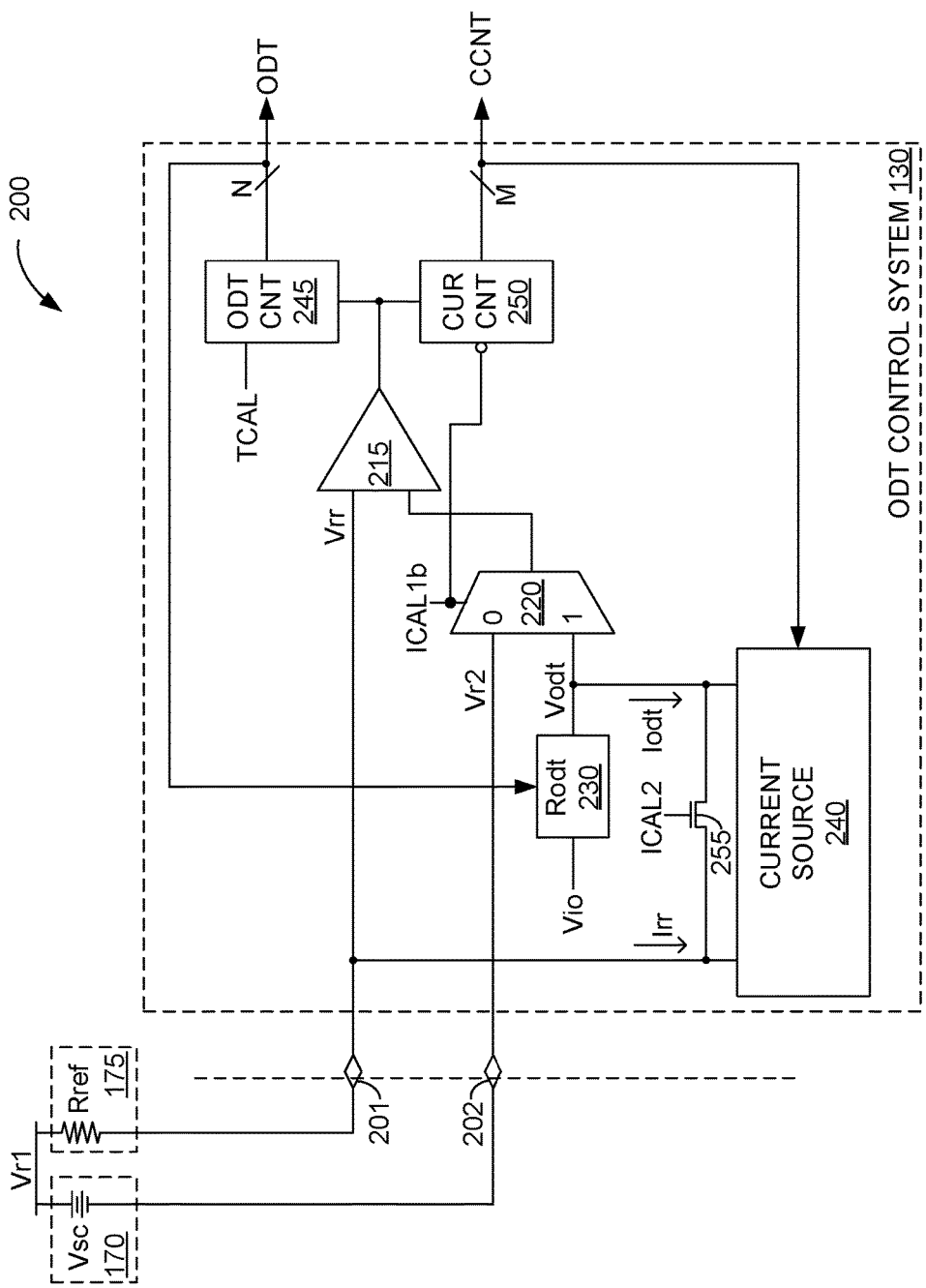
FIG. 2 depicts a termination resistance and drive current calibration system 200 that includes ODT control system 130, reference resistor 175, and reference source 170 of FIG. 1.

FIG. 2 depicts a termination resistance and drive current calibration system 200 that includes ODT control system 130, reference resistor 175, and reference source 170 of FIG. 1. (In general, the first digit of a given numerical designation indicates the Figure in which the indicated element was introduced. For example, reference resistor 175 was introduced in FIG. 1.)

Reference source 170 and reference resistor 175 are external, precision elements connected to system 130 via a pair of pads 201 and 202. Control system 130 includes a comparator 215, an analog multiplexer 220, a reference ODT resistor 230, and a current source 240. Control system 130 calibrates the resistance value Rodt of resistor 230 to match the reference resistance Rref of external precision resistor 175. Control system 130 also matches the current Iodt through resistor 230 with a reference current Irr through reference resistor 175 to produce a desired voltage drop across ODT resistor 230. ODT counter 245 stores a digital value representative of the offset required to calibrate ODT resistor 230, and a current-control counter 250 stores a digital value representative of the offset required to calibrate current source 240. The digital values from counters 245 and 250 are then conveyed throughout die 105 (FIG. 1) to calibrate similar or identical termination elements and current sources within driver circuits 120.

Figure 3:
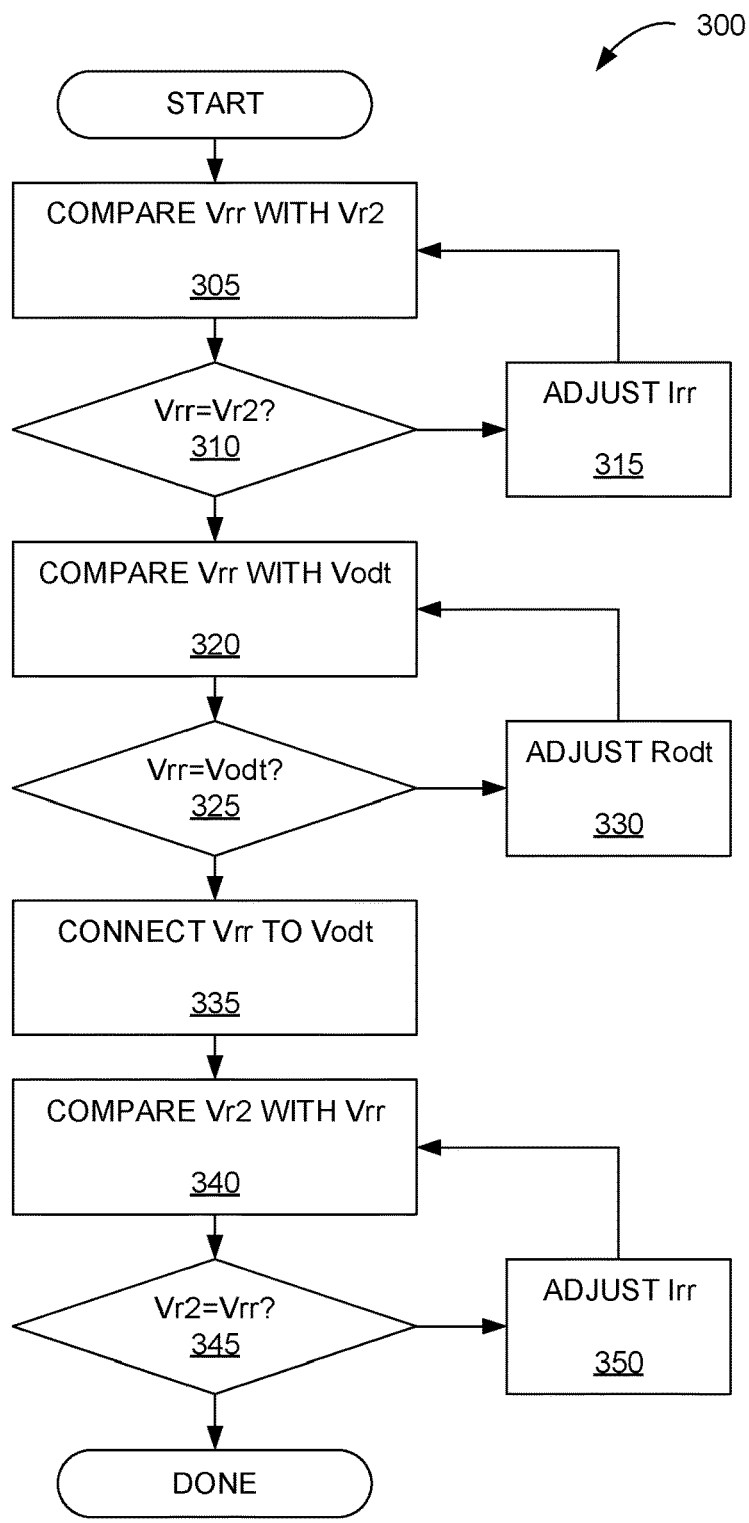
FIG. 3 depicts a process 300 employed by control system 130, as detailed in FIG. 2, to calibrate reference ODT resistor 230 and ODT current Iodt.

FIG. 3 depicts a process 300 employed by control system 130, as detailed in FIG. 2, to calibrate reference ODT resistor 230 and ODT current Iodt. First, at step 305, current-calibration signal ICAL1b, an active-low signal, is asserted. Analog multiplexer 220 thus selects second reference Vr2 for comparison with reference Vrr from resistor 175. The inverse of signal ICAL1b, ICAL1, enables current-control counter 250 to increment and decrement in response to output signals from comparator 215.

Current source 240 pulls reference current Irr through reference resistor 175. Per Ohm's law, reference Vrr equals reference Vr2 when the product of reference current Irr and reference resistance Rref equals the swing voltage Vsc across reference source 170 (i.e., when Irr*Rref=Vsc). Comparator 215 compares voltage Vrr with voltage Vr2 (decision 310), and adjusts the contents of current-control counter 250 as necessary to render voltage Vrr equivalent to voltage Vr2 (step 315). For example, if comparator 215 determines that Vrr is lower than Vr2, comparator 215 increments counter 250 to reduce current Irr, and consequently increase the voltage Vrr. The comparison and adjustment of steps 305, 310, and 315 continue until Vrr and Vr2 are substantially equal. At this point, current counter 250 stores a count CCNT that offsets the current Irr provided by current source 240. ODT current Iodt is substantially equal to reference current Irr, so steps 305, 310, and 315 place current Iodt at or near the expected operating level.

The granularity of current-control count CCNT introduces some uncertainty as to the exact reference current Irr and corresponding Iodt. Employing more register bits and associated bus lines for CCNT reduces this uncertainty at a cost of increased overhead.

The next portion of calibration process 300 sets resistance Rodt of resistor 230 substantially equal to reference resistance Rref of precision resistor 175 (i.e., Rodt≈Rref) by adjusting the count in counter 245. The first current-calibration signal ICAL1b is deasserted (held to a logic one), causing multiplexer 220 to apply voltage Vodt from resistor 230 to the second input terminal of comparator 215. Deasserting ICALb also disables counter 250, freezing current control signal CCNT to hold Iodt and Irr constant. A termination calibration signal TCAL to counter 245 is asserted, enabling counter 245 to increment and decrement in response to output signals from comparator 215.

In step 320, comparator 215 compares Vrr and Vodt. ODT counter 245 increments or decrements in response to the output of comparator 215, altering the resistance Rodt through ODT resistor 230. The input voltage Vio to termination resistor 230 is connected to off-chip voltage reference Vr1, and is therefore substantially equivalent to voltage Vr1. Because the currents Irr and Iodt are substantially identical, Ohm's law provides that voltage Vodt is substantially equal to voltage Vrr if resistance Rodt of resistor 230 matches reference resistance Rref of precision resistor 175. Comparator 215 thus adjusts the contents of counter 245 (step 330) until decision 325 determines that voltages Vrr and Vodt are substantially equal. The granularity of ODT-control count ODT introduces some uncertainty as to the exact reference resistance Rodt. This uncertainty can be improved by employing more register bits within counter 245, but this improvement comes at a cost of increased overhead.

Input/output voltage Vio, being distributed on chip, may vary by some small amount from external reference Vr1. The resulting uncertainty combines with other uncertainties, such as those resulting from the measurement granularities of counters 245 and 250, to produce still greater uncertainty. A second current-calibration sequence recalibrates ODT current Iodt using the calibrated ODT resistor 230 and input voltage Vio to reduce this uncertainty.

Returning to FIG. 1, each signal transmission line 115 includes an associated pair of termination elements 145 and 180 connected in parallel between Vio and respective ends of the signal transmission line. To duplicate this arrangement, current control system 130 includes a transistor 255 that shorts reference resistor 175 and ODT resistor 230 in response to a second current-calibration signal ICAL2, effectively connecting resistors 175 and 230 in parallel between node Vio (recall Vr1 is an off-chip version of Vio) and node Vodt. Because voltages Vr1 and Vio and resistances Rref and Rodt are substantially equal, the current between interconnected nodes Irr and Iodt is expected to be quite low.

In step 335, signal TCAL is deasserted and both current-control signals ICAL1b and ICAL2 are asserted. Counter 245, and thus resistance Rodt, is thus held constant as comparator 215 once again compares Vr1 with Vrr (step 340). Counter 250 increments or decrements in response to output signals from comparator 215 (step 350). The calibration process 300 is complete when system 130 voltages Vr2 and Vrr are substantially equal (step 345). The resulting offsets held in counters 245 and 250 are distributed on buses ODT and CCNT to drivers and receivers on the same die to establish appropriate ODT resistances and drive currents in the manner described above in connection with FIG. 1.

The current and resistance calibration steps are carried out using shared resources, including the low-offset, high-gain comparator 215. This sharing of resources saves power and die area. In addition, offset errors introduced by shared components impact the resistance and current calibrations in opposite ways, and so tend to cancel one another. For example, a comparator error that results in a slightly high ODT resistance Rodt produces a slightly low ODT current Iodt. Rodt and Iodt are multiplied to produce the desired swing voltage, so the increase in Rodt tends to cancel the decrease in Iodt.

Figure 4A:
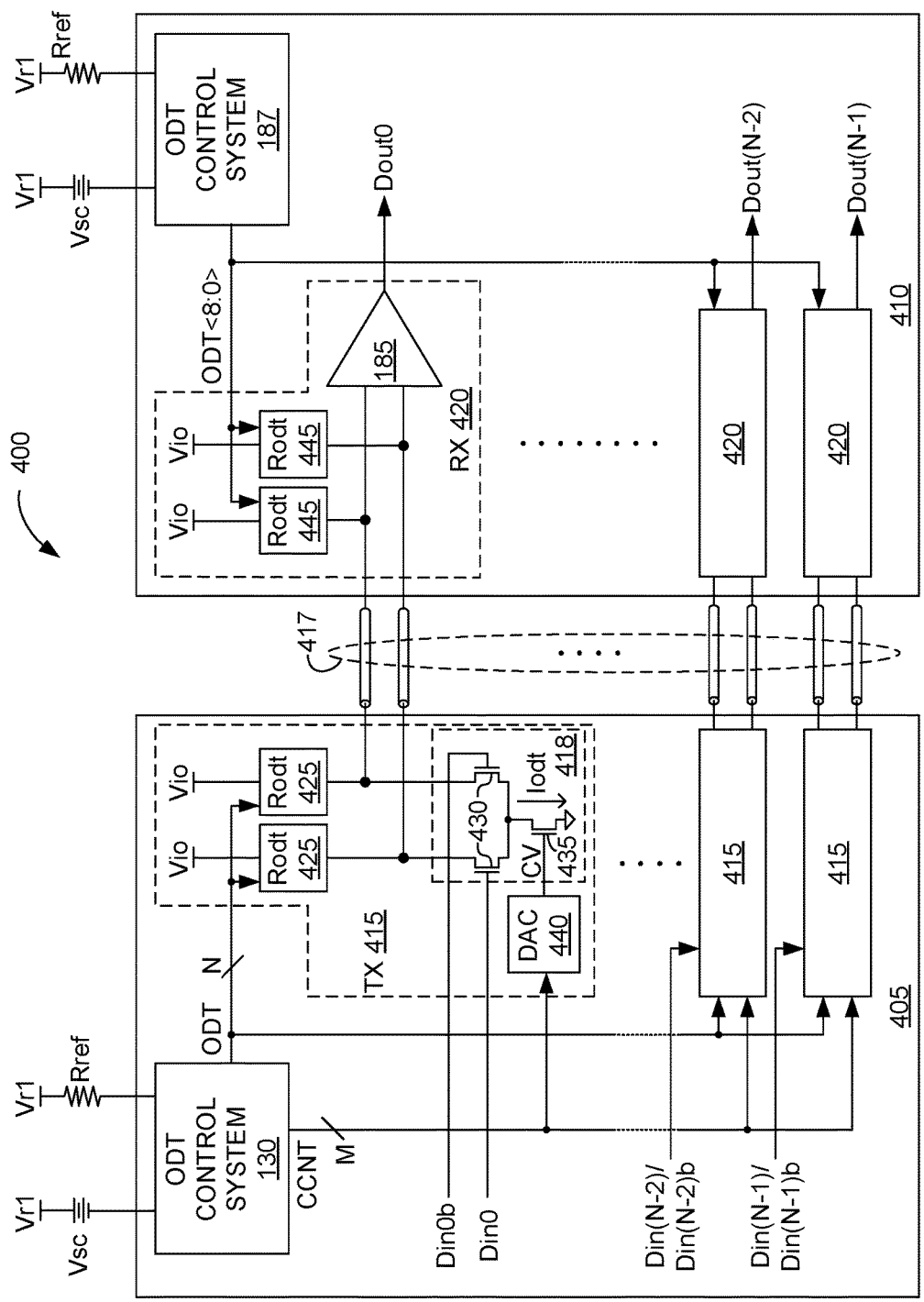
FIGS. 4A and 4B depict communication systems 400 and 450 in accordance with other embodiments.

FIG. 4A depicts a communication system 400 in accordance with another embodiment. System 400 includes components in common with communication system 100 of FIG. 1, like-elements being the same or similar. System 400 includes first and second bus interfaces 405 and 410, each of which is typically a portion of a respective IC die, interconnected via parallel bus 417. One driver circuit 415 of interface 405 and a corresponding receive circuit 420 of interface 410 are detailed: the remaining driver circuits 415 and receive circuits 420 are represented as simple boxes for brevity.

Driver circuit 415 includes a pair of termination elements 425 (ODT resistors) connected between reference Vio and respective ones of a pair of signal transmission lines. Driver circuit 415 additionally includes a current-controlled amplifier 418, which in turn includes a pair of input transistors 430 and a current-source transistor 435. Each of transistors 430 connects between one of termination elements 425 and a power-supply terminal GND via transistor 435. A DAC 440 within driver circuit 415 controls the current through transistor 435 by applying a control voltage CV to the gate of transistor 435, and consequently controls the maximum voltage drop across termination elements 425.

ODT control system 130 derives offsets ODT and CCNT to calibrate termination resistance and drive current in the manner described above in connection with FIGS. 2 and 3. DAC 440 derives control voltage CV from the current-control offset CCNT so that the drive current of amplifier 418 equals the ODT current Iodt calibrated in process 300. Termination elements 425 are fabricated to be identical to reference ODT resistor 230, and so respond in kind to offset signal ODT from control system 130. In short, control system 130 calibrates a reference termination element and a reference drive current by establishing appropriate ODT and CCNT counts, and these counts are applied to driver circuits 415 on the same die to establish and maintain the correct termination resistances, drive currents, and voltage swings.

Figure 4B:
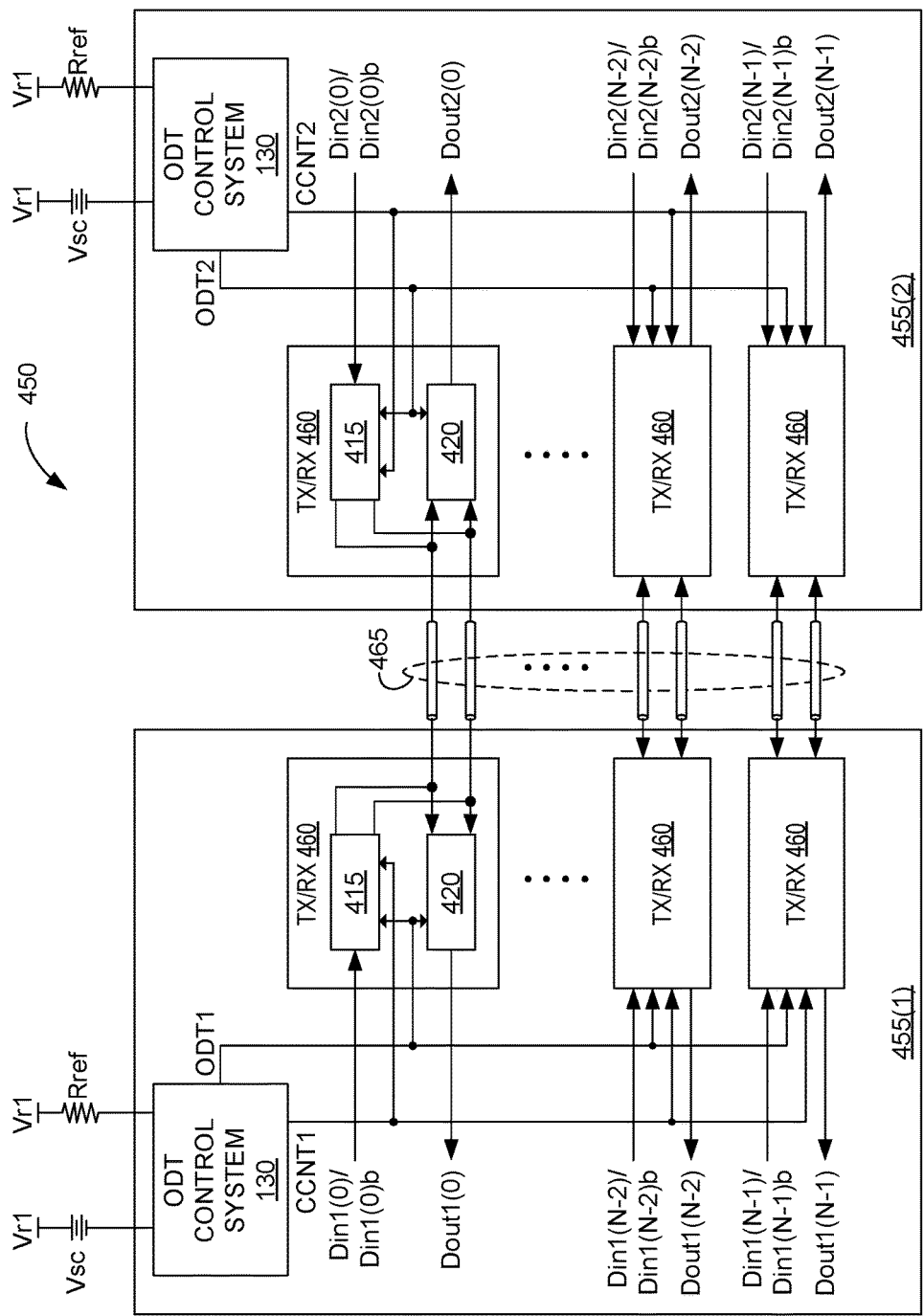

Receive circuit 420 does not generate a drive current, but includes a pair of termination elements 445. Like termination elements 425 of driver circuit 415, termination elements 445 are calibrated by an offset ODT from the associated ODT control system 187. FIG. 4B depicts a communication system 450 in accordance with an embodiment that includes matching first and second bus interfaces 455(1) and 455(2) with interconnected transceivers 460, each of which include both drive and receive circuitry 415 and 420. Signal names in FIG. 4B are similar to those of FIG. 4A but are amended to include either a "1" or a "2" to distinguish first and second bus interfaces 405(1) and 404(2). ODT control system 130 in each interface can be used to establish appropriate termination-element resistance, drive current, and swing voltage levels in such embodiments. Transmission lines 465 can be bidirectional in systems that include interconnected transceiver pairs.

Figure 5:
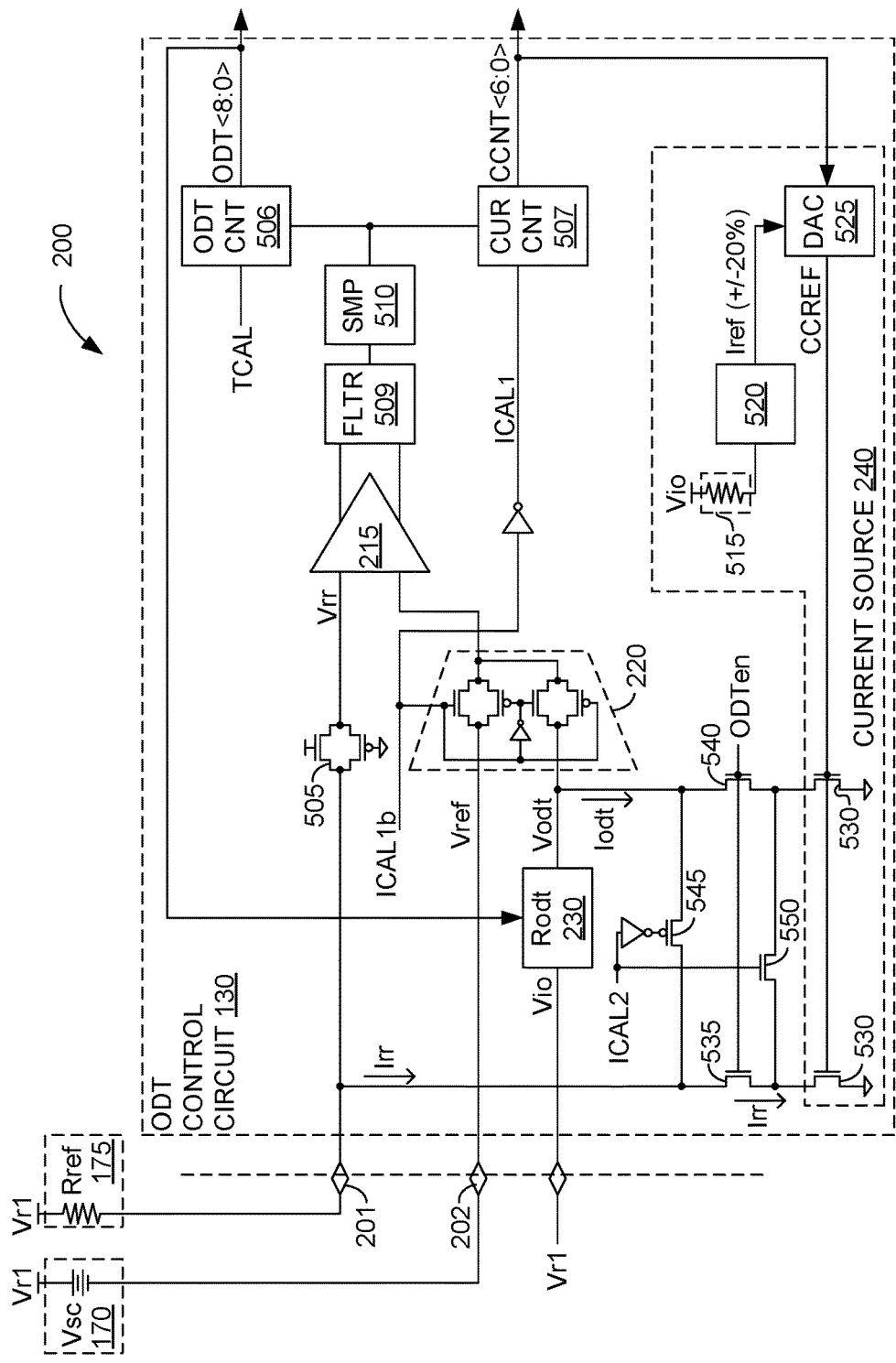
FIG. 5 details an embodiment of calibration system 200 of FIG. 2.

FIG. 5 details an embodiment of calibration system 200 of FIG. 2, like-numbered elements being the same or similar. In this embodiment, ODT control system 130 includes additional components, many of which are included to more closely match the behavior of the reference elements used for calibration with the termination elements and drivers to be calibrated. The example assumes the first reference Vr1 and input/output voltage Vio are each 1.8 volts, reference resistance Rref is 50 ohms, swing calibration voltage Vsc is 350 millivolts, and reference current Irr is 7 milliamps; however, these values are illustrative and not limiting.

Terminal Vrr of comparator 215 connects to reference resistor 175 via a pass gate 505. Pass gate 505 is included to mirror the behavior of a pair of pass gates that are combined to form analog multiplexer 220. Pass gate 505 offers the same resistance as multiplexer 220, and thus cancels voltage differences on the input terminals of comparator 215 that would otherwise introduce errors. Complementary outputs from comparator 215 feed an ODT counter 506 and current counter 507 via a digital filter 509 and sampling latch 510. Sampling latch 510 periodically samples the output of filter 509. If enabled, one of counters 506 and 507 increments or decrements in response to the output from sample latch 510 to adjust the count on one of buses ODT<8:0> or CCNT<6:0>. Comparator 215, filter 509, and latch 510 are shared to save power and die area, and to reduce offset errors in the manner discussed above in connection with FIG. 2.

Current source 240 includes a resistor 515, a reference current source 520, a DAC 525, and a pair of current-source transistors 530. Resistor 515 is a replica of ODT resistor 230, but may be of a different size or value. Resistor 515 is formed using the same process sequence as resistor 230, and so varies in the same manner with process, voltage, and temperature. Current source 520 produces a reference current Iref proportional to the value of resistor 515. DAC 525 uses reference current Iref to derive a control voltage CCREF proportional to the resistance of resistor 515, and consequently proportional to Rodt. Current-control bus CCNT<6:0> then provides offset values to DAC 525 to adjust control voltage CCREF as necessary to calibrate currents Irr and Iodt. In one embodiment, current source 240 provides a range of output currents Irr and Iodt that range from about zero to about twice Iref. Current source 240 begins the calibration sequence in the middle of this range (Irr=Iodt=Iref).

Current source 240 includes an additional pair of transistors 535 and 540, which serve two purposes: first, transistors 535 and 540 can disable current source 240 to save power when ODT control system 130 is not in use; second, when ODT enable signal ODTEN is asserted, transistors 535 and 540 combined with transistors 530 emulate the behavior of transistors 430 and 435 within driver circuit 415 of FIG. 4A. Transistors 535 and 540 are the same size (W/L) as transistors 430, and transistors 530 combined are the same size as transistor 435. With current calibration signal ICAL2 asserted to forward bias a pair of transistors 545 and 550, transistors 530, 535, and 540 and reference ODT resistor 230 and reference resistor 175 together emulate the behavior of transistors 430 and 435 and termination elements 425 of driver circuit 415. The counts within counters 506 and 507 employed to establish appropriate termination resistances and drive currents within system 130 are therefore representative of the counts required to properly adjust the termination elements and drive currents depicted in FIG. 4A.

Figure 6:
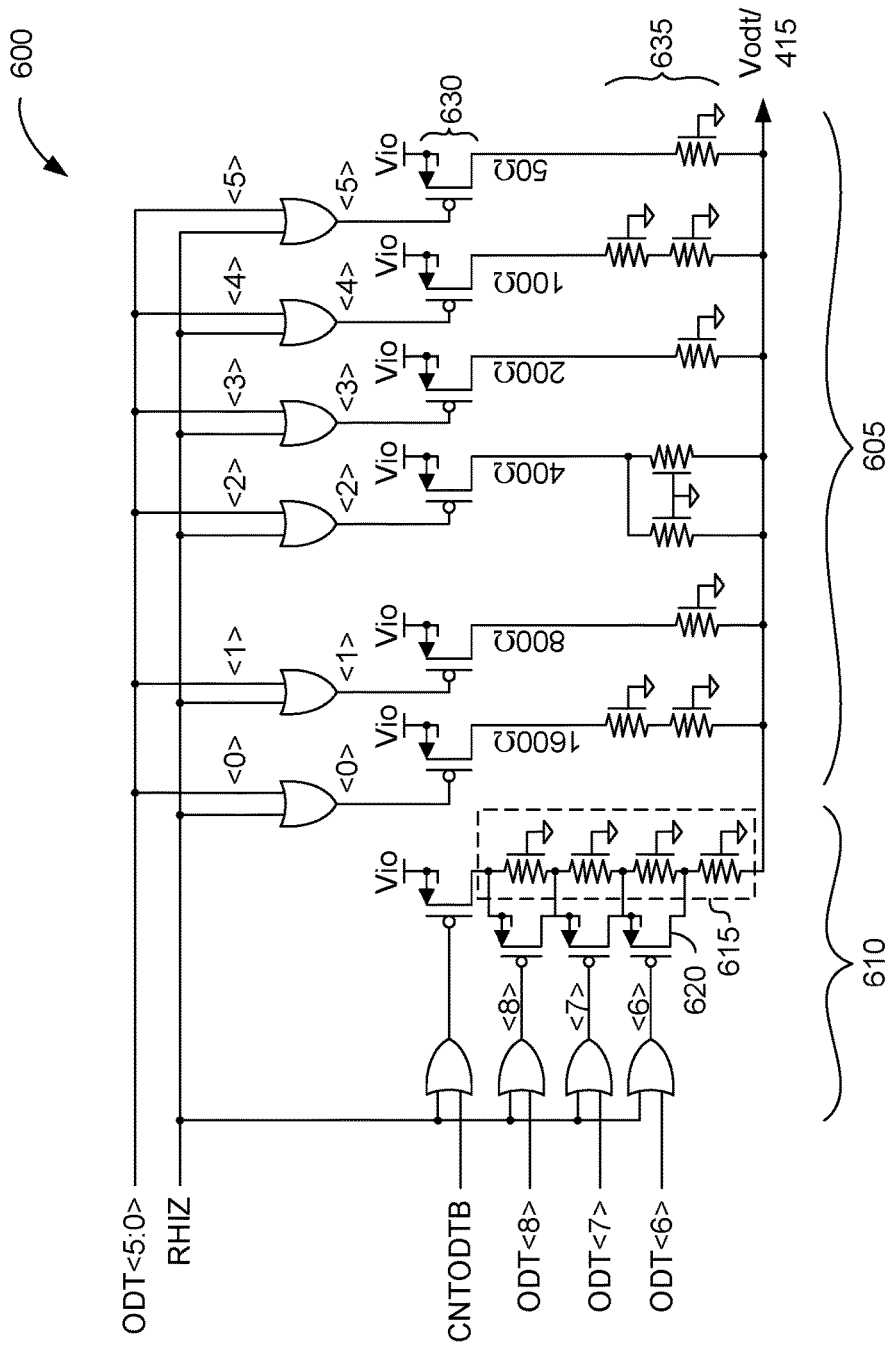
FIG. 6 depicts an ODT termination element 600 in accordance with one embodiment.

FIG. 6 depicts an ODT termination element 600 in accordance with one embodiment. Termination element 600 can be used in place of ODT resistor 230 of FIGS. 2 and 5 and in place of termination elements 425 and 445 of FIG. 4A.

Termination element 600 includes a number of OR gates, each of which includes one input terminal connected to a high-impedance-select terminal RHIZ. When asserted, signal RHIZ disables termination element 600, providing a high impedance between reference Vio and the associated transmission line (for termination elements 425 and 445) or to multiplexer 220 (for reference ODT resistor 230). The following description assumes signal RHIZ is deasserted, so the OR gates merely pass whatever signal is provided on their respective second input terminals.

Termination element 600 includes two separate portions: a binary-weighted portion 605 and a thermometer-coded portion 610. Portion 605 includes a resistor network 635 and a collection of PMOS transistors 630, the gates of which are connected to the first six lines ODT<5:0> of control bus ODT<8:0> of FIG. 5. Each PMOS transistor 630 controls the current through a respective resistive path. These resistive paths provide binary-weighted resistances from about 50 to 1600 ohms, so portion 605 can produce a wide range of resistances by enabling selected transistors 630. (The weighted resistance values can vary widely with process, temperature, and voltage variations, however, hence the need for ODT calibration.)

Transistors 630 are relatively small to reduce the effect of capacitance on transmission lines 417, so transistors 630 provide a significant percentage of the resistance through portion 605 (e.g., as much as about 30% in one embodiment). The I-V characteristics transistors 630 are somewhat non-linear, and this non-linearity produces some non-linearity in the resistance through portion 605. The first current-calibration sequence sets ODT current Iodt close to the operating current before adjusting Rodt so the non-linear response of Rodt does not introduce significant errors in Rodt when Iodt is adjusted during the swing calibration. The first current-calibration sequence can be omitted if accuracy is less important or if the termination elements exhibit more linear I-V characteristics.

The binary-weighted scheme of portion 605 provides a relatively low capacitance, area-efficient means of producing a large number of potential resistance values, but can introduce problematic glitches when switching between values. For example, incrementing the six low-order bits ODT<5:0> from 011111 to 10000 to vary the selected resistance from about 50 ohms to about 52 ohms turns off the right-most one of transistors 630 and turns on the remaining transistors 630. Imperfect timing can produce intermediate resistance values significantly over or under the desired 52 ohms. Such a resistive glitch can cause transmission errors in systems that dynamically monitor and adjust termination values to compensate for supply-voltage and temperature variations.

Thermometer-coded portion 610 addresses the glitch problem associated with portion 610. Portion 610 facilitates fine resistance adjustments by incrementally connecting transistors 620 in parallel with resistive elements in a voltage divider 615. Thermometer coding means that transistors 620 are enabled one at a time, in series. The possible combinations of signals on lines CCNT<8:6> are 000 (lowest resistance), 100, 110, and 111 (highest resistance). Other schemes are possible, and more or fewer series resistors can be included. Transistors 620 are arranged in series to minimize the effects of capacitance.

Portion 605 is calibrated in the manner described above and the offset provided on ODT<5:0> held steady during operation. Portion 610 can likewise be held steady, or can be modified continuously or periodically to compensate for supply-voltage or temperature fluctuations. Like control bits ODT<5:0>, control bits ODT<8:6> can be derived by a common calibration circuit and distributed to a number of termination elements; alternatively, control bits ODT<8:6> can be derived separately for each signal pad. An ODT-control signal CNTODTb can be deasserted to disable portion 610, while calibrating portion 605, for example.

Thermometer-coded portion 610 is less area efficient than portion 605, but can be incremented or decremented without introducing undesirable glitches. For further discussion relating to combining thermometer and binary coding, see U.S. Pat. Nos. 6,606,004 and 6,297,759, each of which is incorporated herein by reference.

Figure 7:
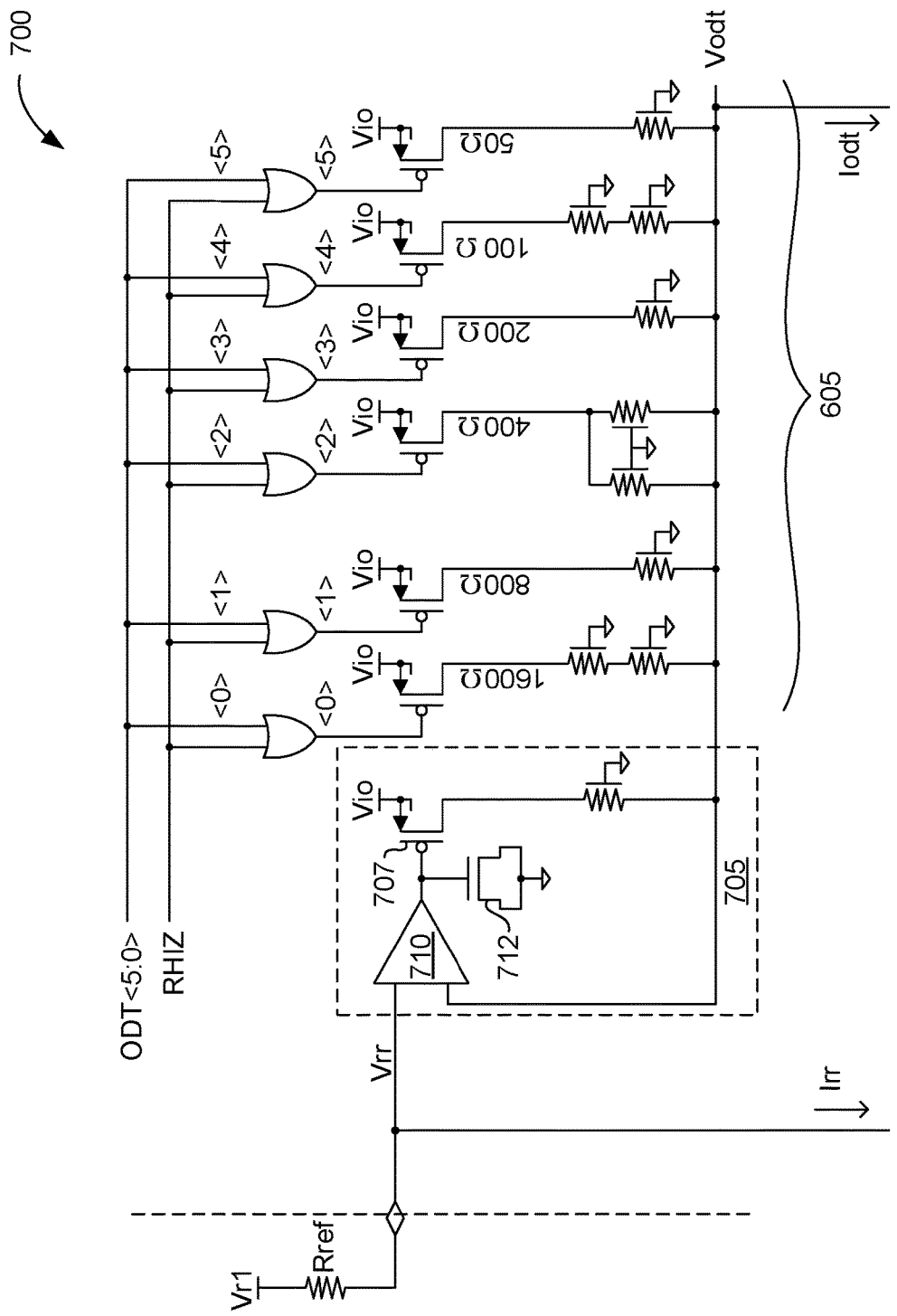
FIG. 7 depicts a termination element 700 in accordance with another embodiment.

FIG. 7 depicts a termination element 700 in accordance with another embodiment. Termination element 700 is similar to termination element 600 of FIG. 6, like numbered elements being the same or similar. Termination element 700 differs from termination element 600 in that thermometer-coded portion 610 of termination element 600 is replaced with an analog resistive element 705 to facilitate fine-tuning of termination resistance.

The resistance between terminals Vio and Vodt includes the parallel contributions from portions 605 and 705. Portion 605 is tuned in the manner described above using an ODT count. An integrator composed of a comparator 710 and capacitor 712 then alters the gate voltage of a transistor 707 to alter the resistance through portion 705 such that voltages Vrr and Vodt are equal. The gate voltage on transistor 707 in a reference ODT termination element can be distributed to similar transistors 707 in termination elements associated with propagating signals. Alternatively, each analog portion 705 can be controlled locally using a dedicated off-chip reference resistor for each pin. In either case, portion 605 of termination elements associated with signal conveyance (e.g., elements 425 and 445) can be controlled by distributed ODT control signals ODT<5:0>.

While the present invention has been described in connection with specific embodiments, variations of these embodiments will be obvious to those of ordinary skill in the art. For example, (1) the external voltage and resistance references may be substituted in other embodiments with on-chip references; (2) the ODT circuits can be constructed entirely of PMOS transistors, as PMOS transistors behave like a resistor when operating in the linear region (e.g., with the gate connected to ground); (3) the thermometer portion 610 (FIG. 6) can have multiple "legs" connected in parallel; and (4) one or more of the transistors 620 within thermometer portion 610 can be replaced with a single transistor controlled by a digital-to-analog converter. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description.

What is claimed is:

1. A method for calibrating a resistance of an on-die termination (ODT) resistor against an off-die resistor using a single comparator, the method comprising:
    drawing a reference-resistor current through the off-die resistor to develop a reference-resistor voltage;
    comparing, with the single comparator, the reference-resistor voltage to a reference voltage;
    adjusting the reference-resistor current through the off-die resistor responsive to an output of the single comparator until the reference-resistor voltage matches the reference voltage to produce a calibrated reference-resistor current and a calibrated reference-resistor voltage;
    creating a calibrated ODT current proportional to the calibrated reference-resistor current;
    drawing the calibrated ODT current through the ODT resistor to develop an ODT voltage;
    adjusting the resistance of the ODT resistor responsive to the output of the single comparator until the ODT voltage matches the calibrated reference-resistor voltage and the reference voltage; and
    second comparing, with the single comparator, the ODT voltage to the calibrated reference-resistor voltage.

2. The method of claim 1, wherein the drawing the reference-resistor current through the off-die resistor comprises passing the reference-resistor current through a digitally controlled source of the reference-resistor current.

3. The method of claim 2, wherein the digitally controlled source of the reference-resistor current is a current source.

4. The method of claim 1, wherein the adjusting the resistance comprises feeding a digital value to the ODT resistor responsive to the output of the single comparator.

5. The method of claim 4, further comprising distributing the digital value to receivers with respective ODT resistances.

6. A method for calibrating a resistance of an on-die termination (ODT) resistor against an off-die resistor using a single comparator, the method comprising:
    drawing a reference-resistor current through the off-die resistor to develop a reference-resistor voltage;
    comparing, with the single comparator, the reference-resistor voltage to a reference voltage;
    adjusting the reference-resistor current through the off-die resistor responsive to an output of the single comparator until the reference-resistor voltage matches the reference voltage to produce a calibrated reference-resistor current and a calibrated reference-resistor voltage;
    creating a calibrated ODT current proportional to the calibrated reference-resistor current; and
    drawing the calibrated ODT current through the ODT resistor to develop an ODT voltage; and adjusting the resistance of the ODT resistor responsive to the output of the single comparator until the ODT voltage matches the calibrated reference-resistor voltage and the reference voltage;
    wherein the creating the calibrated ODT current comprises mirroring the calibrated reference-resistor current.

7. The method of claim 6, wherein the calibrated reference-resistor current and the calibrated ODT current are equal.

8. An on-die termination (ODT) control circuit comprising:
    a comparator having:
        a first comparator input;
        a second comparator input; and
        a comparator output;
    a multiplexer having:
        a first multiplexer input;

a second multiplexer input; and
a multiplexer output coupled to the second comparator input;
an adjustable ODT element having:
a first current-handling terminal;
a second current-handling terminal coupled to the second multiplexer input; and
an ODT control input; and
circuitry coupled between the comparator output and the ODT control input of the adjustable ODT element, the circuitry to provide a digital value to the ODT control input to calibrate an impedance through the adjustable ODT element.

9. The ODT control circuit of claim 8, the circuitry including a counter to store the digital value.

10. The ODT control circuit of claim 8, further comprising:
a first source of an adjustable first current from the first comparator input; and
a second source of an adjustable second current from the second current-handling terminal of the adjustable ODT element.

11. The ODT control circuit of claim 10, wherein the first source mirrors the second source.

12. The ODT control circuit of claim 11, wherein the adjustable first current equals the adjustable second current.

13. The ODT control circuit of claim 12, wherein the second source mirrors the first source.

14. The ODT control circuit of claim 10, the circuitry to provide a second digital value to the first source, the second digital value to calibrate at least one of the adjustable first current from the first comparator input and the adjustable second current from the second current-handling terminal of the adjustable ODT element.

15. The ODT control circuit of claim 8, further comprising a pass gate disposed between a reference node and the first comparator input.

16. The ODT control circuit of claim 8, further comprising a voltage source to supply a reference voltage to first multiplexer input.

17. The ODT control circuit of claim 16, further comprising a second voltage source to supply a second reference voltage to first current-handling terminal.

18. The ODT control circuit of claim 17, further comprising an external reference resistor coupled to the first comparator input.

19. The ODT control circuit of claim 8, further comprising receivers with respective ODT resistances coupled to the circuitry to receive the digital value.

20. The ODT control circuit of claim 8, further comprising:
a first reference node coupled to the first comparator input;
a second reference node coupled to the first multiplexer input; and
a third reference node coupled to the first current-handling terminal of the adjustable ODT element.

* * * * *